United States Patent [19]

Hassler

[11] Patent Number: 5,742,059
[45] Date of Patent: *Apr. 21, 1998

[54] READOUT SYSTEM FOR A SOLID STATE IMAGE CONVERTER

[75] Inventor: Dietrich Hassler, Uttenreuth, Germany

[73] Assignee: Siemens Aktiengesellschaft, Munich, Germany

[*] Notice: The term of this patent shall not extend beyond the expiration date of Pat. No. 5,532,491.

[21] Appl. No.: 650,711

[22] Filed: May 20, 1996

[30] Foreign Application Priority Data

Jul. 7, 1995 [DE] Germany ............... 195 24 856.2

[51] Int. Cl.⁶ .................. H01L 27/146; G01T 1/24
[52] U.S. Cl. ............... 250/370.09; 348/302; 348/308
[58] Field of Search ................ 250/370.09, 370.06, 250/208.1; 378/98.8; 348/294, 302, 308

[56] References Cited

U.S. PATENT DOCUMENTS

| | | | |
|---|---|---|---|
| 4,597,012 | 6/1986 | Itoh et al. | |
| 4,602,289 | 7/1986 | Sekine | 250/208.1 |
| 4,827,145 | 5/1989 | Arques | 250/578 |
| 4,996,413 | 2/1991 | McDaniel | 250/208.1 |
| 5,070,236 | 12/1991 | Miyake | 250/208.1 |
| 5,140,148 | 8/1992 | Kitamura et al. | 250/208.1 |
| 5,194,724 | 3/1993 | Sekine | 250/208.1 |
| 5,235,174 | 8/1993 | Ikeda et al. | 250/208.1 |
| 5,315,102 | 5/1994 | Abe et al. | 250/208.1 |
| 5,406,067 | 4/1995 | Keller | 250/208.1 |
| 5,426,292 | 6/1995 | Bird et al. | 348/308 |
| 5,448,613 | 9/1995 | Haendle et al. | 378/98.7 |
| 5,510,623 | 4/1996 | Sayag et al. | 250/208.1 |
| 5,532,491 | 7/1996 | Hassler et al. | 250/370.09 |

FOREIGN PATENT DOCUMENTS 0 622 851  4/1994  European Pat. Off. .
41 23 203  10/1992  Germany .

OTHER PUBLICATIONS

"Amorphous Silicon Arrays Develop A Medical Image," Street et al., Circuits and Devices (1993) pp. 38–42.

Primary Examiner—Edward J. Glick
Assistant Examiner—Darren Jiron
Attorney, Agent, or Firm—Hill & Simpson

[57] ABSTRACT

An x-ray image-generating system having an a-Si:H detector matrix is constructed so that different enlargements are possible with a small number of terminal conductors. Two groups of pixels of the detector matrix can be read out together by means of voltage pulses of different levels, respectively applied in alternation to the two pixel groups on a line conductor common to both pixel groups.

1 Claim, 7 Drawing Sheets

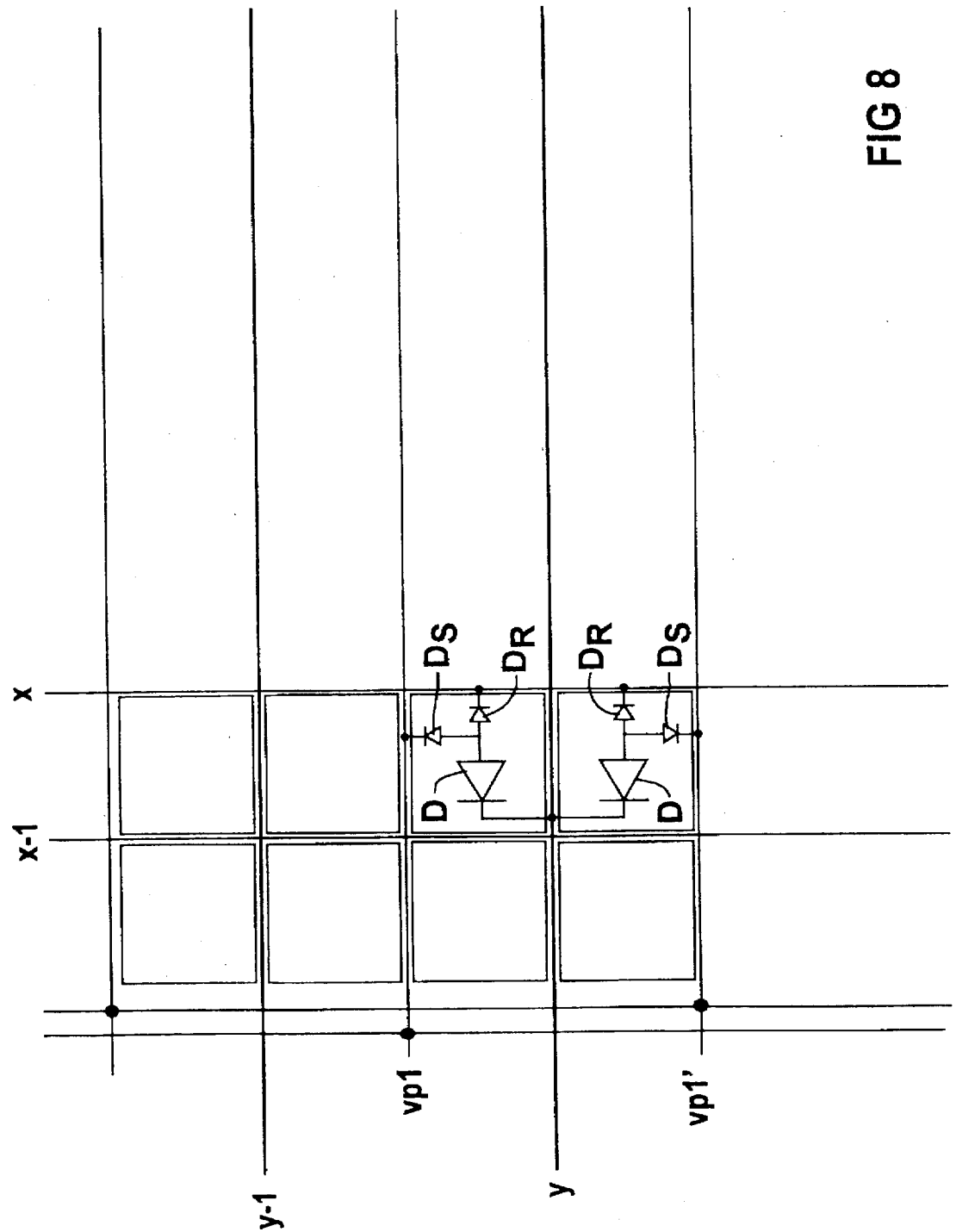

5,742,059

1
READOUT SYSTEM FOR A SOLID STATE IMAGE CONVERTER

BACKGROUND OF THE INVENTION

1. Field of the Invention

The present invention is directed to a readout system for a solid state image converter, of the type suitable for use in an x-ray imaging system.

2. Description of the Prior Art

In x-ray image-generating systems, in practice spatial resolutions matched to the particular task at hand are required. Thus, for a general overview a low resolution is sufficient, while for sections a high resolution is often necessary. For the production of individual exposures, it is known to use films, film/foil combinations or memory foils having different resolutions. For fluoroscopy x-ray image intensifiers are used having an adjustable (selectable) enlargement and resolution.

From German OS 41 23 203, a radiation-sensitive solid state image transducer is known that is formed from two matrices of detector elements with different resolution. There is no information provided, however, as to how the detector elements that form pixels are driven. A solid state image transducer for x-ray imaging is specified in "Circuits and Devices" (IEEE) (July 1993) 38–42. Different resolutions of the detector matrix disclosed therein are not provided. In German OS 34 42 789, a two-dimensional image reader that is driven row-by-row and column-by-column is shown. Again, there is no provision for different resolutions. Finally, in European Application 0 622 851 a two-dimensional image sensor is shown in which the pixels are combined group by group. The individual groups are driven by means of signals of different polarity.

SUMMARY OF THE INVENTION

An object of the present invention is to provide an x-ray image-generating system wherein a matching of the resolution to respective imaging requirements is possible in a simple and cost-effective manner.

The above object is achieved in accordance with the principles of the present invention in a solid state image converter having a pixel matrix which is read out line-by-line, wherein the pixels include two groups of pixels connected to a common conductor, with voltages of different levels being produced on the common conductor so that the two groups of pixels can be selectively read out via this common conductor.

In the inventive x-ray image-generating system, a small number of terminal conductors is provided. As the enlargement (zoom) increases, the spatial resolution increases simultaneously, but the image sampling rates remain constant. The zone of enlargement can be centrally located. Its dimensions are easily configurable. A retarded readout possibility with full resolution is possible for the entire surface.

2

Figure 3:
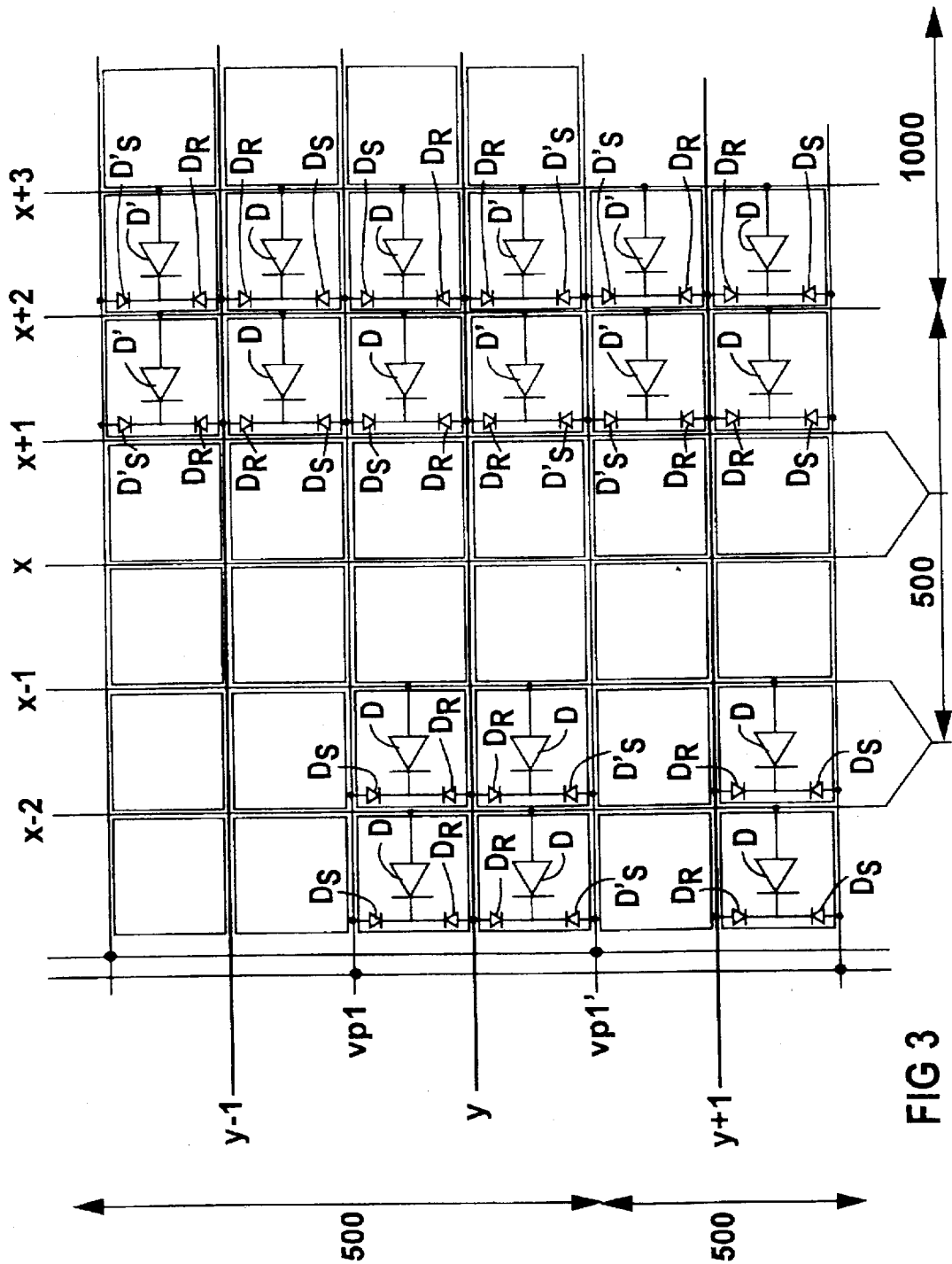
FIG. 3 shows the arrangement of pixels and conductor, given a uniform structuring of an x-ray image-generating system according to the invention.
Figure 5:
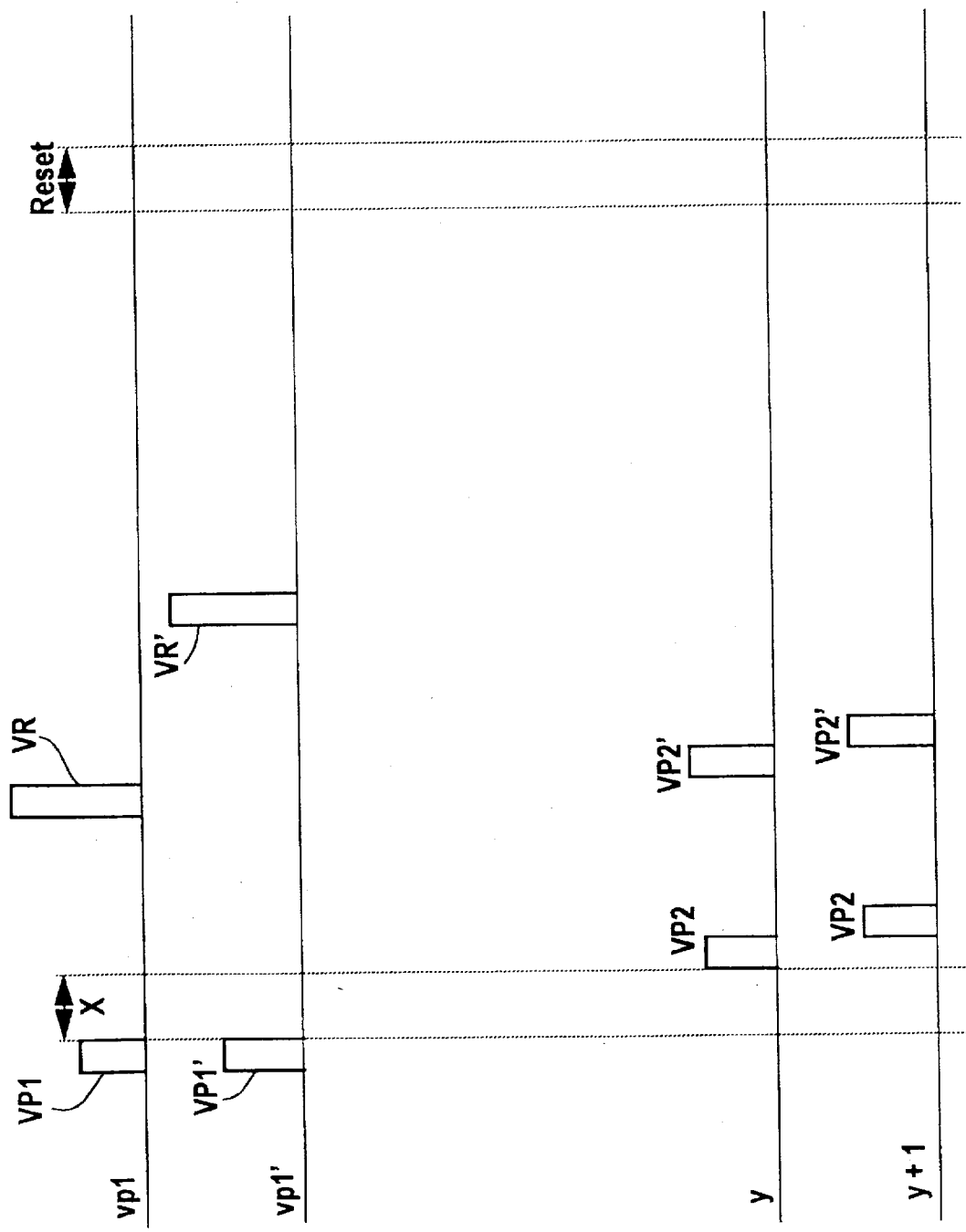

FIG. 5 is a pulse diagram for the x-ray image-generating system according to FIG. 3.

Figure 6:
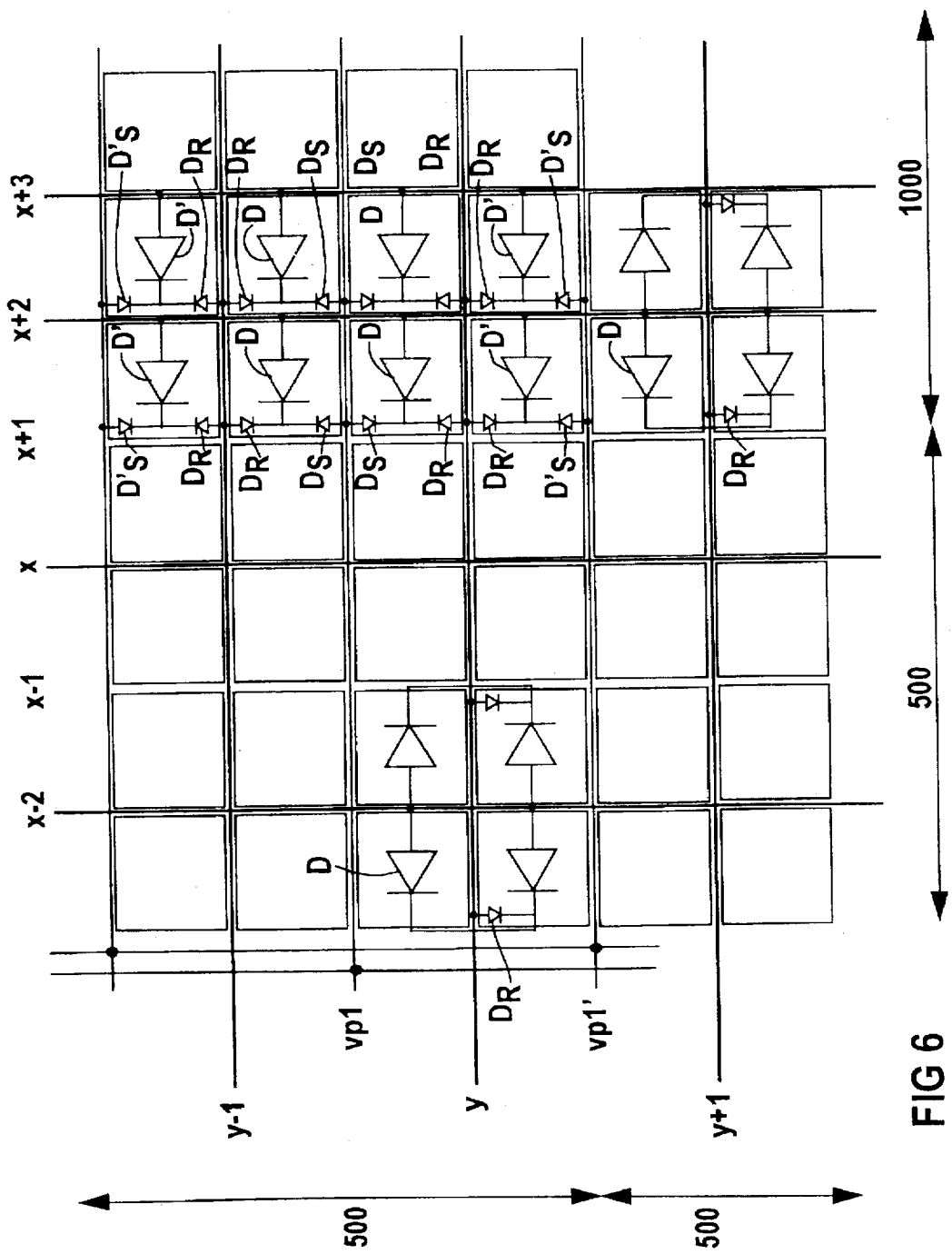
Figure 7:
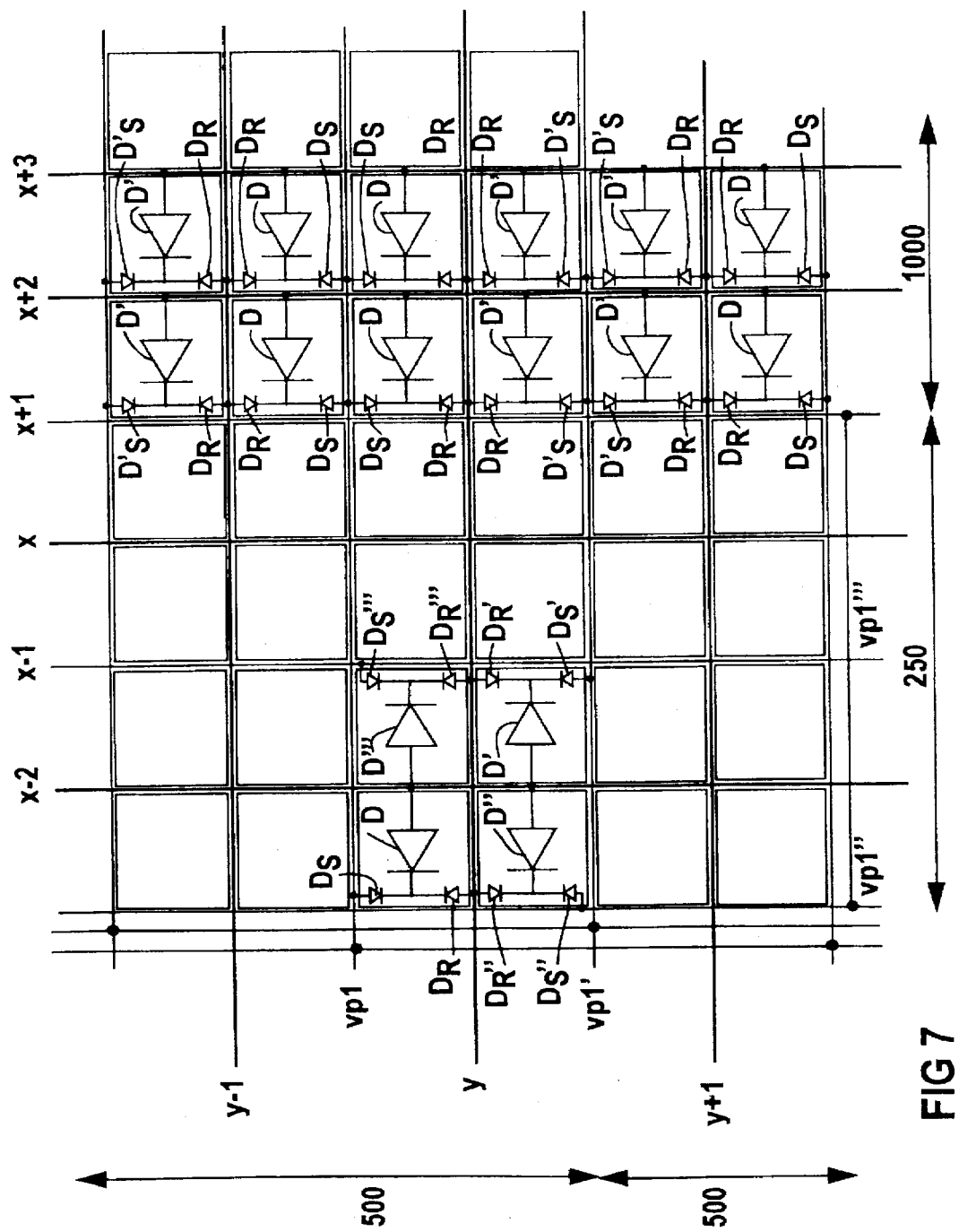

FIGS. 6 and 7 respectively show two examples of the arrangement of pixels and conductors, given non-uniform structuring of an x-ray image-generating system according to the invention.

FIG. 8 shows an alternative circuit for a pixel of an X image-generating system according to the invention.

DESCRIPTION OF THE PREFERRED EMBODIMENTS

Figure 2:
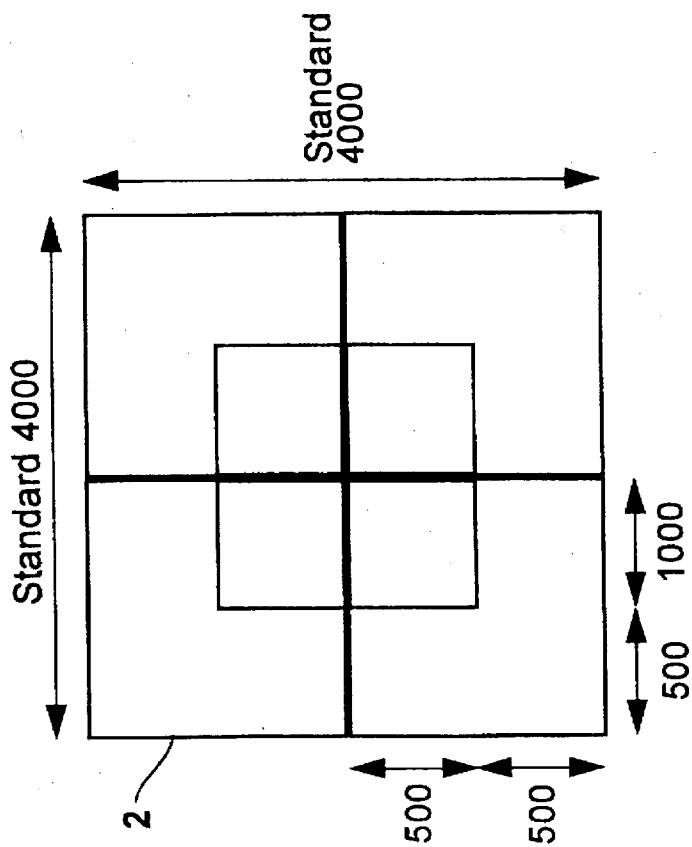
FIGS. 1 and 2 are respective schematic representations of an x-ray image-generating system for explanation of the inventive concept.
Figure 1:
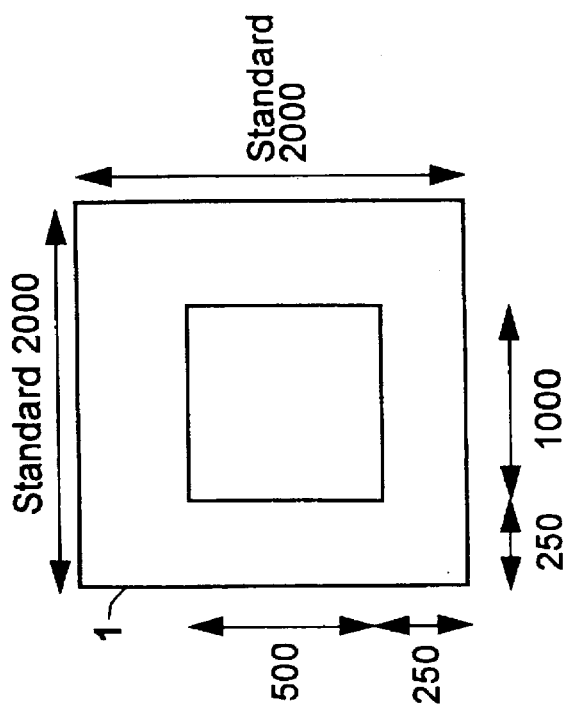

FIGS. 1 and 2 show two examples of the result of an inventive polling (interrogation) of the a-Si:H detector matrix. FIG. 1 indicates a detector 1 formed from a continuous substrate having a conventional matrix of 2000× 2000 pixels with 2000×2000 terminals, which has a central zoom surface formed by a matrix of 1000×1000 pixels. According to the invention, the total number of terminals, and thereby the outlay of allocated electronics, is reduced to 1000×1500.

FIG. 2 shows a detector assembled from four subsurfaces, having the conventional 4000×4000 terminal conductors, which according to the invention is reduced to 2000×3000 terminals.

FIG. 3 shows the inner construction of an assembled detector according to FIG. 2. The region of enlargement is set by the right surface between x+1 and vp1'. Each pixel consists of a photodiode D and a readout switching diode $D_R$, and has an additional switching diode $D_S$. These switching diodes $D_S$ enable the charging voltages VP1 and VP1' of the photodiodes D to be set at different levels via the corresponding interconnected conductors vp1 and vp1'. Thus with the voltage level of the reading voltages VP2, a respective row of pixels lying above or below a selected line conductor can be individually operated and read out via the line conductors y−1, y and y+1. This is possible almost without loss of time, as is shown in the pulse diagram of FIG. 4.

The region of enlargement has a read terminal for each column in order to achieve full resolution at the highest readout speed. In the edge area underneath the zoom surface, four pixels are interconnected for whole-surface readout at a constant image rate and halved resolution. This is undertaken as a group by means of addition of the read results of adjacent columns (in hardware or software) and conventional operation with only one charging and reading voltage VP1 and VP2, which can be applied only via the conductors y and the diodes $D_R$, even without the use of the switching diode $D_S$. In the region to the left of the zone of enlargement, the interconnection of the columns on the lower outer edge is fashioned such that the size of the zoom surfaces can be easily selected, e.g. by cutting the edge of the glass support or etching back the connection conductors. The grouped readout in this region and in the zoom field takes place, as stated above, through the use of only one charging and reading voltage VP1 and VP2.

Figure 4:
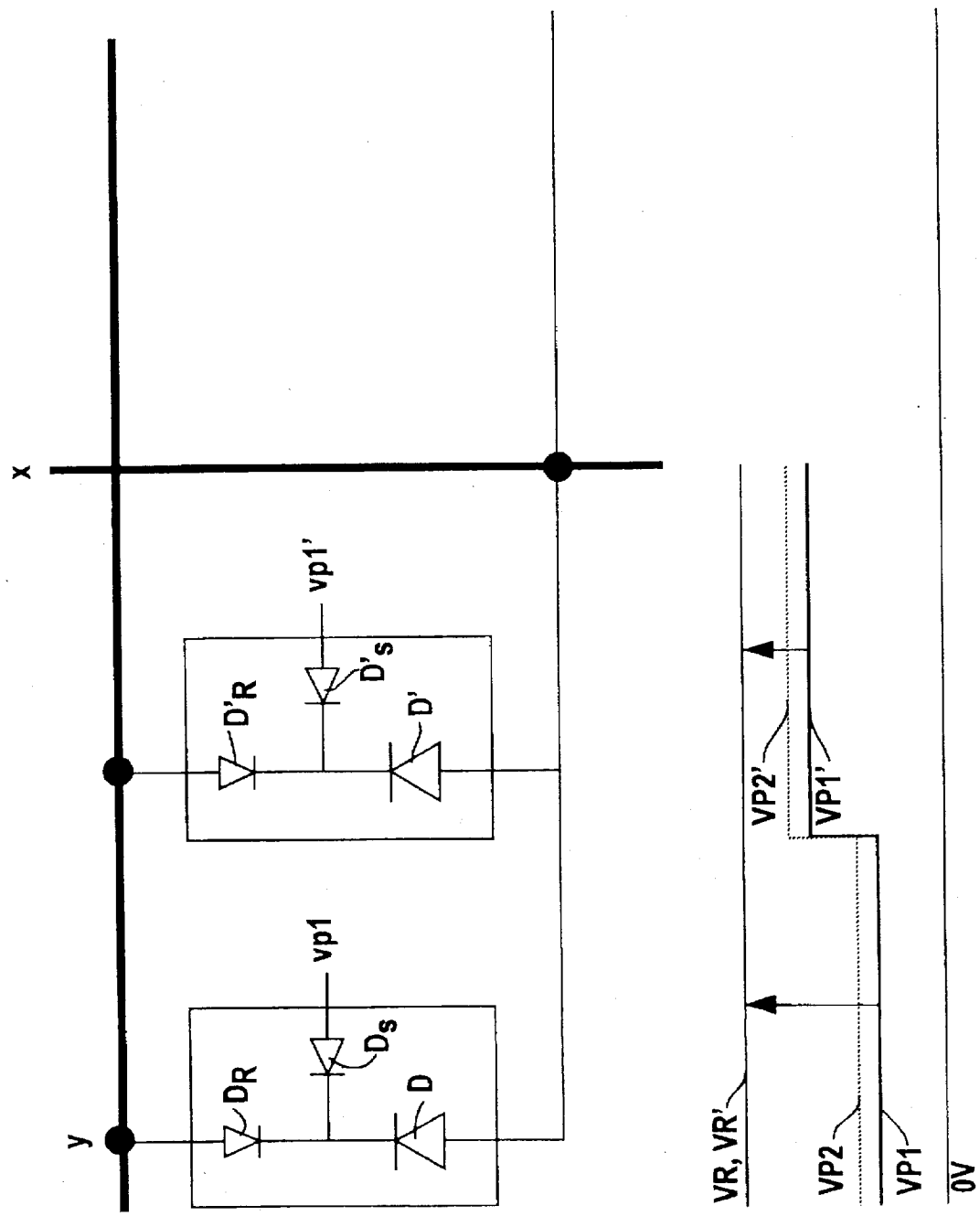
FIG. 4 is a schematic diagram for an image point with two sub-pixels in the x-ray image-generating system according to FIG. 2.

FIG. 4 shows that for two pixels lying one over the other, the different charging voltages still lead only to a doubling of the breakdown voltage, not to a multiplication thereof.

FIG. 5 shows the pulse sequence for the zoom region. All diodes connected to the conductors vp1 via switching diodes $D_S$ are charged to the reverse voltage of the charging voltage VP1. At the same time, the diodes connected with the conductor vp1' are set to the higher voltage VP1'. After the X exposure (time) window X has elapsed, all lines y are first read out with the voltages VP2<VP2'. Whereby only the diodes charged to the voltages VP1 are affected. The more highly charged diodes are decoupled, because the switching diodes $D_S$ still remain blocked. At the end of this readout phase, all the diodes that have been read out are set to the reset voltage VR>VP2 via the conductors vp1, in order to disconnect them in the subsequent second readout step. This second step ensues with readout voltages VP2>VP1, and, by means of the higher voltage, affects the diodes that have not yet been read out. For symmetry, a voltage VR'=VR on the conductors vp1' concludes the readout, and a reset light irradiation prepares the matrix for a new readout cycle. The information read out in the edge area next to the zoom field is discarded (direction-dependent spatial resolution). The zoom region can be extended downwards if more lines are operated, so that a rectangular zoom field arises.

The lengthening of the readout time in comparison with the prior art is due only to the voltages VR and VR', which, amounting to about 100 µs together, is insignificant.

The use of the full surface at half resolution (grouped pixels) ensues, e.g., without the use of the conductors vp1 and vp1' in the conventional mode with a charging voltage VP1, whereby the interconnection/addition of the columns in the zoom region can be accomplished by the hardware through the readout IC, or by software in a computer.

If the simple configurability of the surface portions from the zoom field to the overall surface is foregone, in the outer region the loss of surface area available for light collecting due to the switching diodes $D_S$ and the reading diodes $D_R$ (up to one) can be avoided, and, according to FIG. 6, a hardware grouping can be carried out on the detector matrix (the illustrated variant employs two reading diodes). Undivided pixels with fourfold surfaces are also feasible, if the conductors are led around externally. The loss of surface area due to the additional switching diode can be kept small if the diode in the layout is positioned on (or under) the conductors.

In the previously shown structures of the detector matrix, the entire panel cannot be read out slowly with full resolution, however, this is sometimes desirable. The embodiment according to FIG. 7 remedies this. The enlargement surface is constructed as previously described.

The readouts of the zoom region with full resolution (including rectangular shape) and of the overall image field in half resolution remain unaltered. The left edge region can be read out at a lower image frequency if two further, higher charging voltages VP1" and VP1'" are applied together with the charging voltages VP1 and VP1' via the conductors vp1" and vp1'". The reset voltages VR, VR', VR" and VR'" are also to be set about twice as high (over the highest readout voltage VP2'").

If the fourfold blocking voltage cannot be technologically achieved, the dynamic range of the detector can be reduced by the use of smaller charging voltages, until the voltage VR no longer exceeds the blocking voltage. Multiple exposures and readouts at lower light power and addition of the images in the computer can circumvent the problem, with the disadvantage of longer exposure times.

FIG. 8 shows a circuit with an exchanged sequence of the series connection of the diodes, by means of which the same result can be achieved, given a corresponding matching of the voltages VP1, VP2, etc.

Although modifications and changes may be suggested by those skilled in the art, it is the intention of the inventor to embody within the patent warranted hereon all changes and modifications as reasonably and properly come within the scope of his contribution to the art.

I claim as my invention:

1. A readout system for a solid state image converter comprising:

x-ray detector matrix containing a plurality of pixels arranged in lines, said plurality of pixels containing two groups of pixels and each pixel containing voltage-responsive electrical components with pixels in a first of said two groups containing voltage-responsive components responsive to a first voltage level and pixels in a second of said two groups containing voltage-responsive components responsive to a second voltage level, different from said first voltage level;

means for reading out said pixels line-by-line;

a common electrical conductor connected to said two groups of pixels; and said means for reading out said pixels including means for producing voltages of said first and second voltage levels on said common conductor for separately reading out the pixels of said two groups using said common conductor.

* * * * *